(12) United States Patent
Nakayama

(10) Patent No.: US 9,152,037 B2
(45) Date of Patent: Oct. 6, 2015

(54) PATTERN CORRECTION METHOD, STORAGE MEDIUM, INFORMATION PROCESSING APPARATUS, METHOD OF MANUFACTURING MASK, EXPOSURE APPARATUS, AND METHOD OF MANUFACTURING DEVICE

(71) Applicant: CANON KABUSHIKI KAISHA, Tokyo (JP)

(72) Inventor: Ryo Nakayama, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 13/855,025

(22) Filed: Apr. 2, 2013

(65) Prior Publication Data

US 2013/0288164 A1   Oct. 31, 2013

(30) Foreign Application Priority Data

Apr. 27, 2012   (JP) ................................ 2012-103833

(51) Int. Cl.
*G03F 1/36* (2012.01)
*G06F 17/50* (2006.01)

(52) U.S. Cl.
CPC . *G03F 1/36* (2013.01); *G06F 17/50* (2013.01)

(58) Field of Classification Search
CPC .................................. G03F 1/36; G06F 17/50
USPC ...................................................... 430/5, 30
See application file for complete search history.

(56) References Cited

U.S. PATENT DOCUMENTS 7,739,650 B2   6/2010   Torres Robles et al.

OTHER PUBLICATIONS

Michael C. Smayling et al., "Low k1 Logic Design using Gridded Design Rules", Proc. of SPIE, USA, SPIE, 2008, vol. 6925, p. 69250B.
Koichiro Tsujita et al., "Supreme lithographic performance by simple mask layout based on lithography and layout co-optimization", Proc. of SPIE, USA, SPIE, 2011, vol. 7973, p. 79730D.

*Primary Examiner* — Christopher Young
(74) *Attorney, Agent, or Firm* — Rossi, Kimms & McDowell LLP

(57) ABSTRACT

The present invention provides a pattern correction method of, when a plurality of pattern elements on a mask used to process a line pattern formed on a substrate are transferred to the substrate, performing proximity effect correction of each pattern element such that a transferred image obtains a dimension equal to a target dimension, comprising setting, based on a density of a pattern element in a peripheral region surrounding a pattern element of interest, a dimension of the pattern element whose transferred image formed under the density of the pattern element has a dimension equal to the target dimension as a reference value for the pattern element of interest, and calculating a dimension of transferred image of the pattern element of interest while changing around the reference value and determining the dimension of the pattern element of interest based on the calculation result.

18 Claims, 13 Drawing Sheets

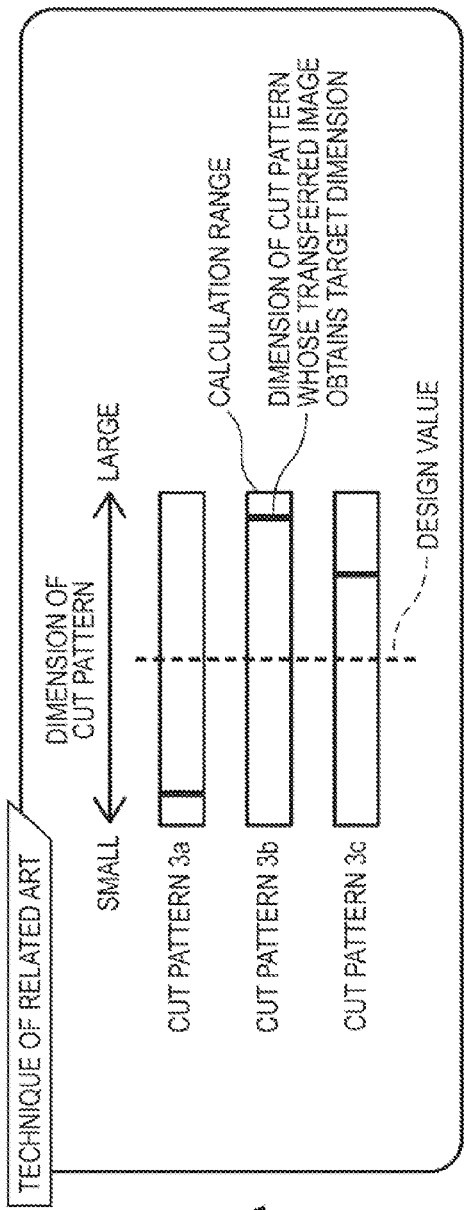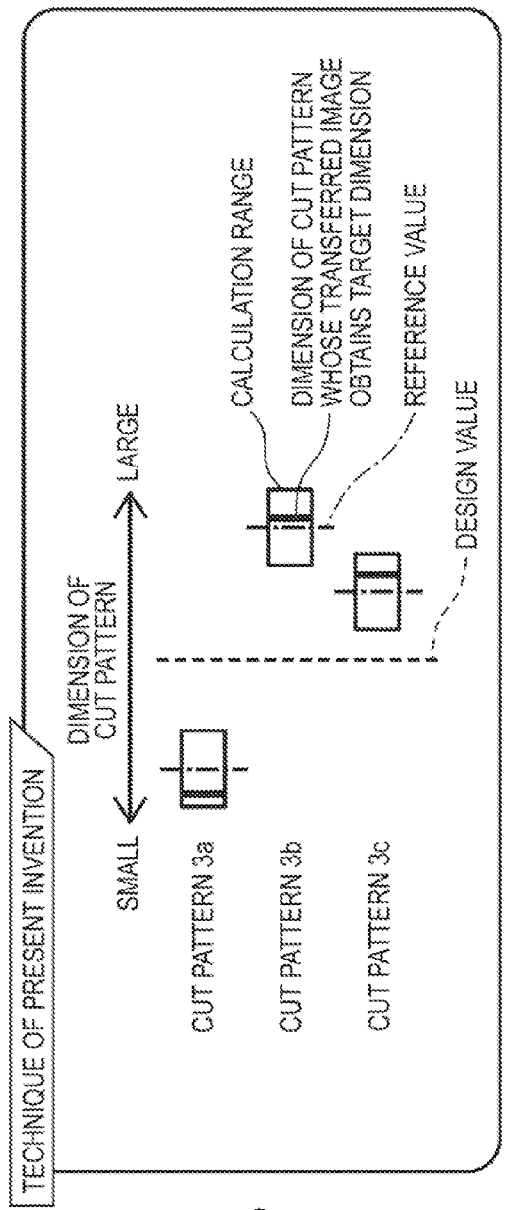

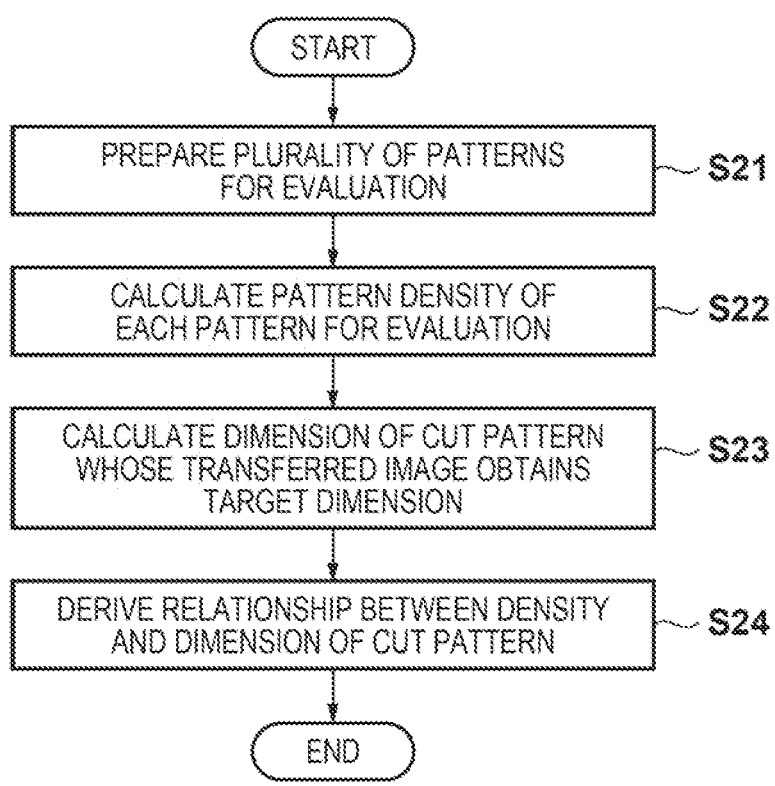

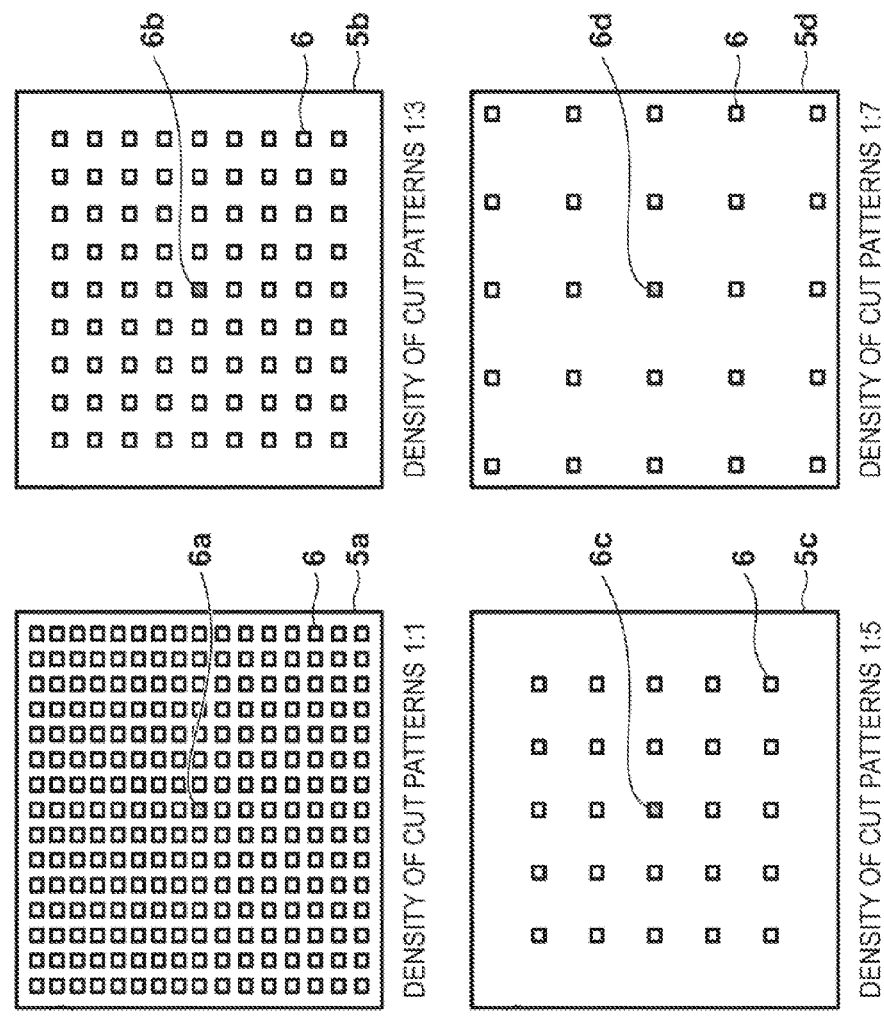

PATTERN CORRECTION METHOD, STORAGE MEDIUM, INFORMATION PROCESSING APPARATUS, METHOD OF MANUFACTURING MASK, EXPOSURE APPARATUS, AND METHOD OF MANUFACTURING DEVICE

BACKGROUND OF THE INVENTION

1. Field of the Invention

The present invention relates to a pattern correction method, a storage medium, an information processing apparatus, a method of manufacturing a mask, an exposure apparatus, and a method of manufacturing a device.

2. Description of the Related Art

When manufacturing a semiconductor device, it is important to faithfully transfer a design pattern to a substrate using an exposure apparatus. In recent years, however, a low-$k_1$ process is widely used as the miniaturization and large-scale integration of a semiconductor integrated circuit progress. When the low-$k_1$ process is used for a conventional two-dimensional circuit pattern, a pattern formed on a mask and a pattern transferred to a substrate using it have largely different shapes because of the proximity effect. Even when complex proximity effect correction is performed for the mask pattern, faithfully transferring the design pattern to the substrate may be difficult. To cope with this, a technique called a one-dimension layout technique is proposed in non-patent literature 1.

The one-dimension layout technique disclosed in non-patent literature 1 is a technique of forming line and space (L & S) patterns having a single pitch on a substrate in advance and partially removing the line patterns to form a circuit pattern. In the one-dimension layout technique, a mask on which a plurality of pattern elements (cut patterns) are formed is used. The plurality of cut patterns correspond to portions to remove the line patterns. The cut patterns are transferred to the substrate, and the line patterns of the transferred portions are removed, thereby forming a circuit pattern.

Non-patent literature 2 proposes a method of performing proximity effect correction for each cut pattern to faithfully transfer a plurality of cut patterns to a substrate in the one-dimension layout technique. In the non-patent literature 2, the dimension of each cut pattern is calculated based on a design value that is the same for all cut patterns, and a cut pattern dimension is calculated such that the transferred pattern obtains the target dimension.

A mask used in the one-dimension layout technique generally has a plurality of cut patterns having the same shape. There exist regions where the cut pattern density is high and regions where the density is low. For this reason, the proximity effect affects the cut patterns in different manners, and the dimension of each cut pattern whose transferred pattern on the substrate obtains the target dimension also changes. Hence, when the dimension of a cut pattern whose transferred pattern on the substrate obtains the target dimension is calculated based on the design value that is the same for all cut patterns, the number of times of repeated computation necessary for the calculation increases. Hence, a long time is needed for calculating the dimensions of the cut patterns.

[Non-Patent Literature 1] Michael C. Smayling et. al., "Low k1 Logic Design using Gridded Design Rules", Proc. of SPIE, USA, SPIE, 2008, Vol. 6925, p. 69250B

[Non-Patent Literature 2] Koichiro Tsujita et. al., "Supreme lithographic performance by simple mask layout based on lithography and layout co-optimization", Proc. of SPIE, USA, SPIE, 2011, Vol. 7973, p. 79730D

SUMMARY OF THE INVENTION

The present invention provides a technique advantageous for correcting a mask pattern.

According to one aspect of the present invention, there is provided a pattern correction method of, when a plurality of pattern elements on a mask used to process a line pattern formed on a substrate are transferred to the substrate, performing proximity effect correction of each pattern element such that a transferred image obtains a dimension equal to a target dimension, comprising: setting, based on a density of a pattern element in a peripheral region surrounding a pattern element of interest out of the plurality of pattern elements, a dimension of the pattern element whose transferred image formed under the density of the pattern element has a dimension equal to the target dimension as a reference value for the pattern element of interest; and calculating a dimension of transferred image of the pattern element of interest while changing the dimension of the pattern element of interest around the reference value and determining the dimension of the pattern element of interest based on the calculation result.

According to one aspect of the present invention, there is provided a non-transitory computer-readable storage medium storing a program for causing a computer in an information processing apparatus to execute a pattern correction method of, when a plurality of pattern elements on a mask used to process a line pattern formed on a substrate are transferred to the substrate, performing proximity effect correction of each pattern element such that a transferred image obtains a dimension equal to a target dimension, the method comprising: setting, based on a density of a pattern element in a peripheral region surrounding a pattern element of interest out of the plurality of pattern elements, a dimension of the pattern element whose transferred image formed under the density of the pattern element has a dimension equal to the target dimension as a reference value for the pattern element of interest; and calculating a dimension of the pattern element of interest while changing the dimension of the pattern element of interest around the reference value and determining the dimension of the pattern element of interest based on the calculation result.

Further aspects of the present invention will become apparent from the following description of exemplary embodiments with reference to the attached drawings.

BRIEF DESCRIPTION OF THE DRAWINGS

FIG. 2A is a conceptual view for explaining a technique of a related art;

FIG. 2B is a conceptual view for explaining a technique of the present invention;

FIG. 3 is a flowchart showing a step of deriving the relationship between the density and the dimension of a cut pattern according to the first embodiment;

FIG. 4 is a view showing patterns for evaluation;

DESCRIPTION OF THE EMBODIMENTS

Figure 1:
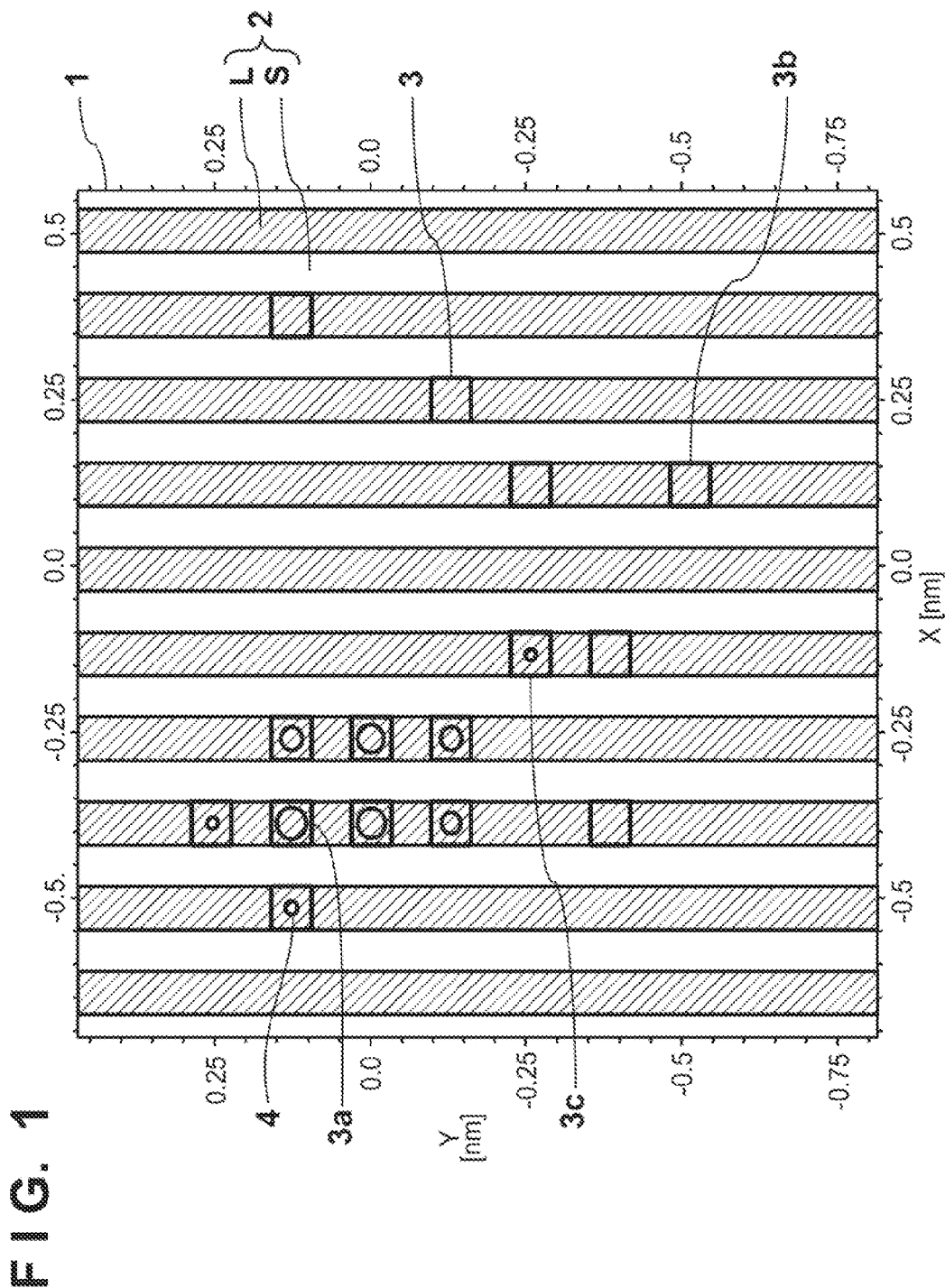
FIG. 1 is a view showing a result of optical image calculation using a design value as the dimensions of cut patterns.

The present invention is applicable to the manufacture of various kinds of devices, for example, semiconductor chips such as ICs and LSIs, display devices such as liquid crystal panels, detecting elements such as magnetic heads, and image sensors such as CCDs or generation of mask patterns used in micromechanics. Micromechanics indicates a technique of manufacturing a high-performance mechanical system in microns by applying a semiconductor integrated circuit manufacturing technique to form a microstructure, or the mechanical system itself. The present invention is usable as, for example, a correction method of performing proximity effect correction of the dimension of a mask pattern by an exposure apparatus including a projection optical system such that the image transferred to a substrate obtains a dimension equal to a target dimension.

Exemplary embodiments of the present invention will be described below with reference to the accompanying drawings. Note that the same reference numerals denote the same members throughout the drawings, and a repetitive description thereof will not be given.

In the embodiments of the present invention to be described below, a description will be made using a one-dimension layout technique in which a line pattern arrangement is formed on a substrate in advance, and the line patterns are processed (partially removed or connected to each other), thereby forming a desired circuit pattern. In the one-dimension layout technique, a mask pattern having a plurality of pattern elements is used. The plurality of pattern elements correspond to portions to remove or connect the line patterns. The pattern elements are transferred to the substrate, and the line patterns are partially removed or connected to each other in the transferred portions, thereby forming a desired circuit pattern. In each embodiment of the present invention, line and space (L & S) patterns having a single pitch are used as the line patterns arranged on the substrate. A plurality of cut patterns having the same shape are used as the plurality of pattern elements. For example, the target dimension (design value) of a transferred image transferred to the substrate by a cut pattern is 64 nm square, and the line width of the L & S pattern formed on the substrate is 64 nm. The transferred images transferred to the substrate by the plurality of cut patterns are obtained by optical image calculation. The optical image calculation is performed using an illumination condition having an outer sigma of 0.95, an annular ratio of 0.76, and a numerical aperture (NA) of 1.35. In the embodiments of the present invention, optical image calculation is used. However, any calculation method other than the optical image calculation, for example, resist calculation is also usable. In the embodiments of the present invention, the calculation is performed while changing the dimension of a cut pattern under the fixed illumination condition. However, the calculation may be done while changing the illumination condition.

A result obtained by performing optical image calculation directly using the target dimension (design value) of a transferred image as the dimension of a cut pattern formed on a mask in the one-dimension layout technique will now be described with reference to FIG. 1. FIG. 1 is a view showing a plurality of cut patterns 3 arranged on a substrate 1 with L & S patterns 2 formed thereon. Referring to FIG. 1, the solid fills indicate the line patterns of the L & S patterns 2, rectangles arranged on the L & S patterns 2 indicate the cut patterns 3, and circles arranged inside the cut patterns 3 indicate transferred images 4 on the substrate 1. Because of the proximity effect, the cut patterns 3 are transferred large to the substrate 1 in a region where the density of the cut patterns 3 is high or small in a region where the density is low. For example, in a cut pattern 3a arranged in a region where the density of the cut patterns 3 is high, the circle representing the transferred image 4 is large. On the other hand, in a cut pattern 3b arranged in a region where the density of the cut patterns 3 is low, no circle representing the transferred image 4 is seen. Moreover, in a cut pattern 3c arranged in a region where the density of the cut patterns 3 is low, the circle representing the transferred image 4 is small. As described above, if the design value is directly used as the dimensions of the cut patterns 3, the cut patterns 3 are transferred or not transferred to the substrate 1 depending on the portion due to the proximity effect. For this reason, when performing proximity effect correction, that is, when calculating the dimension of each cut pattern 3 such that the transferred image 4 obtains the target dimension, the number of times of repeated computation increases if the calculation is performed based on the design value that is the same for all the cut patterns 3, as in the technique of the related art. Hence, in the technique of the related art, a long time is required to calculate the dimensions of the cut patterns. In the present invention, the reference value is set for each cut pattern 3, and the dimension of each cut pattern 3 is calculated based on the reference value such that the transferred image 4 obtains the target dimension.

The technique of the related art and that of the present invention will be described here with reference to FIGS. 2A and 2B. FIGS. 2A and 2B are conceptual views of the technique of the related art and that of the present invention. A broken line indicates the design value, a thick line indicates the dimension of a cut pattern whose transferred image obtains a dimension equal to the target dimension, and a rectangle indicates the range in with calculation is performed while changing the cut pattern dimension. According to the technique of the related art shown in FIG. 2A, the dimensions of all cut patterns are calculated based on the same reference value while being changed around the design value. For every cut pattern, a range to calculate the dimension of a cut pattern such that the transferred image obtains a dimension equal to the target dimension is determined. In this case, since the calculation is performed based on the same reference value, the calculation range is wide, and the number of times of repeated computation necessary for obtaining the dimension of the cut pattern whose transferred image obtains a dimension equal to the target dimension increases. On the other hand, in the technique of the present invention shown in FIG. 2B, the reference value is set for each cut pattern, and the calculation is performed around the reference value. For this reason, the calculation range is narrow, and the number of times of repeated computation can be reduced. A correction method of performing proximity effect correction for the dimension of a pattern element (cut pattern) according to the technique of the present invention will be described below.

First Embodiment

A correction method according to the first embodiment of the present invention will be explained. In the correction method of the first embodiment, first, the relationship between the density of a cut pattern and the dimension of the cut pattern whose transferred image formed under that density obtains a dimension equal to the target dimension (to be referred to as the relationship between the density and the dimension of a cut pattern hereinafter) is derived using a plurality of patterns for evaluation. Next, the density of one focused cut pattern (cut pattern of interest (pattern element of interest)) out of the plurality of cut patterns is calculated. The dimension corresponding to the calculated density of the cut pattern of interest is determined based on the relationship between the density and the dimension of the cut pattern. The determined dimension is set as the reference value for the cut pattern of interest. The dimension of the cut pattern of interest is calculated while being changed around the reference value. The dimension of the cut pattern of interest whose transferred image obtains a dimension equal to the target dimension is determined. In the correction method according to the first embodiment, the density of the cut pattern of interest is calculated based on the number of cut patterns included in the peripheral region surrounding the cut pattern of interest.

First, a step of deriving the relationship between the density and the dimension of a cut pattern from a plurality of patterns for evaluation will be described with reference to FIG. 3. FIG. 3 is a flowchart showing the step of deriving the relationship between the density and the dimension of a cut pattern using a plurality of patterns for evaluation.

In step S21, a plurality of patterns for evaluation are prepared. The plurality of patterns for evaluation include a plurality of cut patterns periodically arranged, respectively. The cut patterns in the plurality of patterns for evaluation have densities different from each other. In the first embodiment, four types of patterns 5a to 5d for evaluation that include cut patterns 6 at different densities are prepared, as shown in FIG. 4. The density of the cut patterns 6 in each of the patterns 5a to 5d for evaluation is defined by the ratio of portions where the cut patterns 6 exist to portions where the cut patterns 6 do not exist. In this example, the ratios are set to 1:1, 1:3, 1:5, and 1:7 (the area ratios are 1:3, 1:8, 1:24, and 1:48). In the one-dimension layout technique, the cut patterns 6 having the same shape are only periodically arranged in each pattern 5 for evaluation. Hence, the structure of the pattern 5 for evaluation is simple, and it is only necessary to prepare several types of patterns 5 for evaluation. On the other hand, in a two-dimensional pattern as described in U.S. Pat. No. 7,739,650, the dimension, shape, and density of a circuit pattern need to be changed. Hence, the structure of the pattern for evaluation becomes complex, and a lot of different types of patterns for evaluation need to be prepared.

In step S22, the cut pattern density in each pattern for evaluation is calculated. The patterns 5a to 5d for evaluation have a simple structure in which the plurality of cut patterns 6 are periodically arranged. For this reason, the density of the cut patterns 6 is obtained as the ratio of the area of the cut patterns 6 to the area of the entire pattern 5 for evaluation.

In step S23, the dimensions of single cut patterns 6a to 6d arranged centrally in the patterns 5a to 5d for evaluation are calculated by optical image calculation such that their transferred images on the substrate obtain a dimension equal to the target dimension (64 nm square). In this way, the dimension of each cut pattern whose transferred image obtains a dimension equal to the target dimension under the cut pattern density that changes depending on the pattern for evaluation is obtained. In the four types of patterns 5a to 5d for evaluation prepared in step S21, the dimensions of the cut patterns 6a to 6d whose transferred images have a dimension equal to the target dimension are calculated as 64.18 nm, 79.27 nm, 82.12 nm, and 82.11 nm, respectively.

Figure 5:
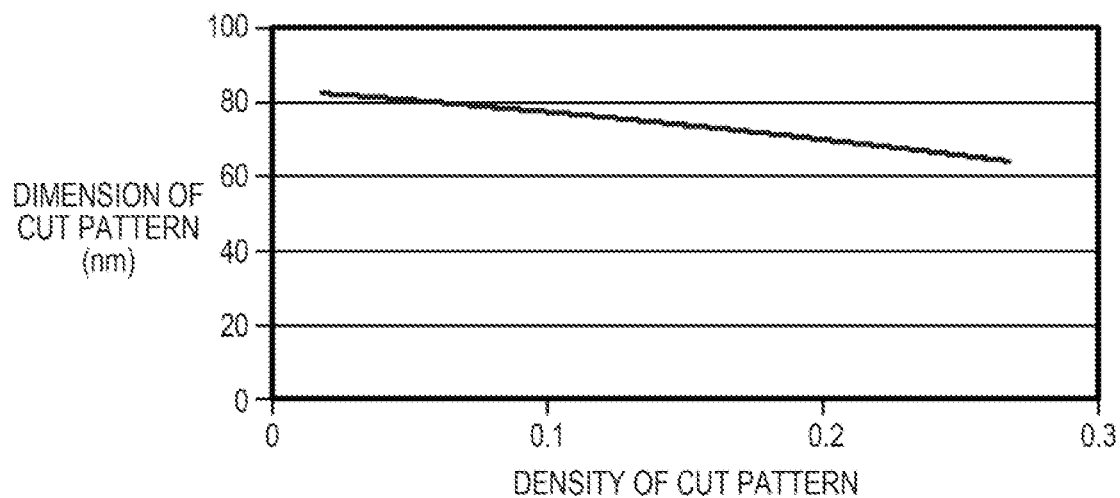
FIG. 5 is a graph showing the relationship between the density and the dimension of a cut pattern according to the first embodiment.

In step S24, the relationship between the density and the dimension of a cut pattern is derived using the results in steps S22 and S23. FIG. 5 is a graph showing the relationship between the density and the dimension of a cut pattern derived using the four types of patterns for evaluation prepared in step S21. In FIG. 5, the abscissa represents the cut pattern density, and the ordinate represents the dimension of a cut pattern whose transferred image has a dimension equal to the target dimension.

Figure 6:
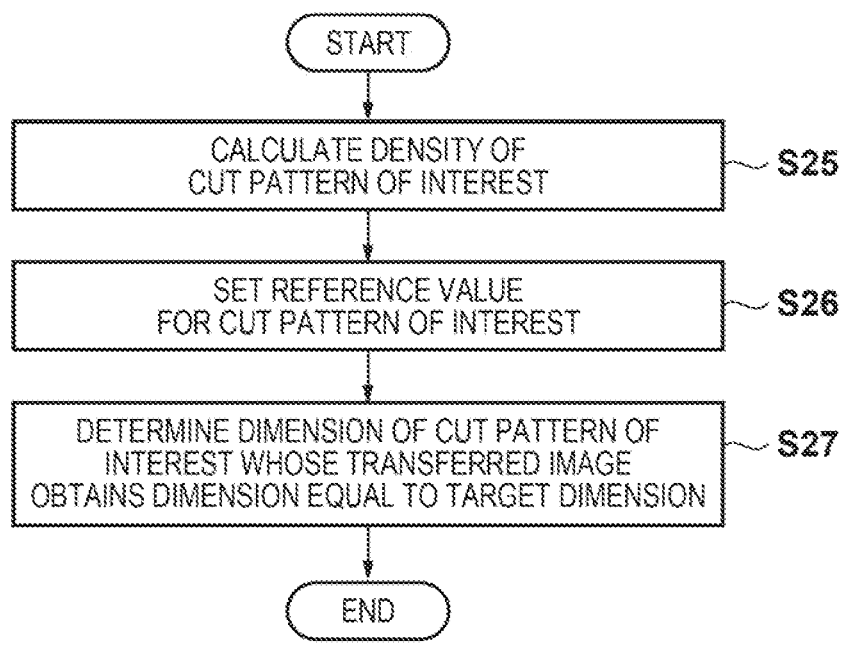
FIG. 6 is a flowchart showing steps until the dimension of a cut pattern is determined according to the first embodiment.

Steps of setting the reference value of the dimension of each cut pattern based on the relationship between the density and the dimension of a cut pattern derived using the patterns for evaluation and determining the dimension of the cut pattern whose transferred image obtains a dimension equal to the target dimension will be described with reference to FIG. 6. FIG. 6 is a flowchart showing the steps until the dimension of a cut pattern is determined.

Figure 7:
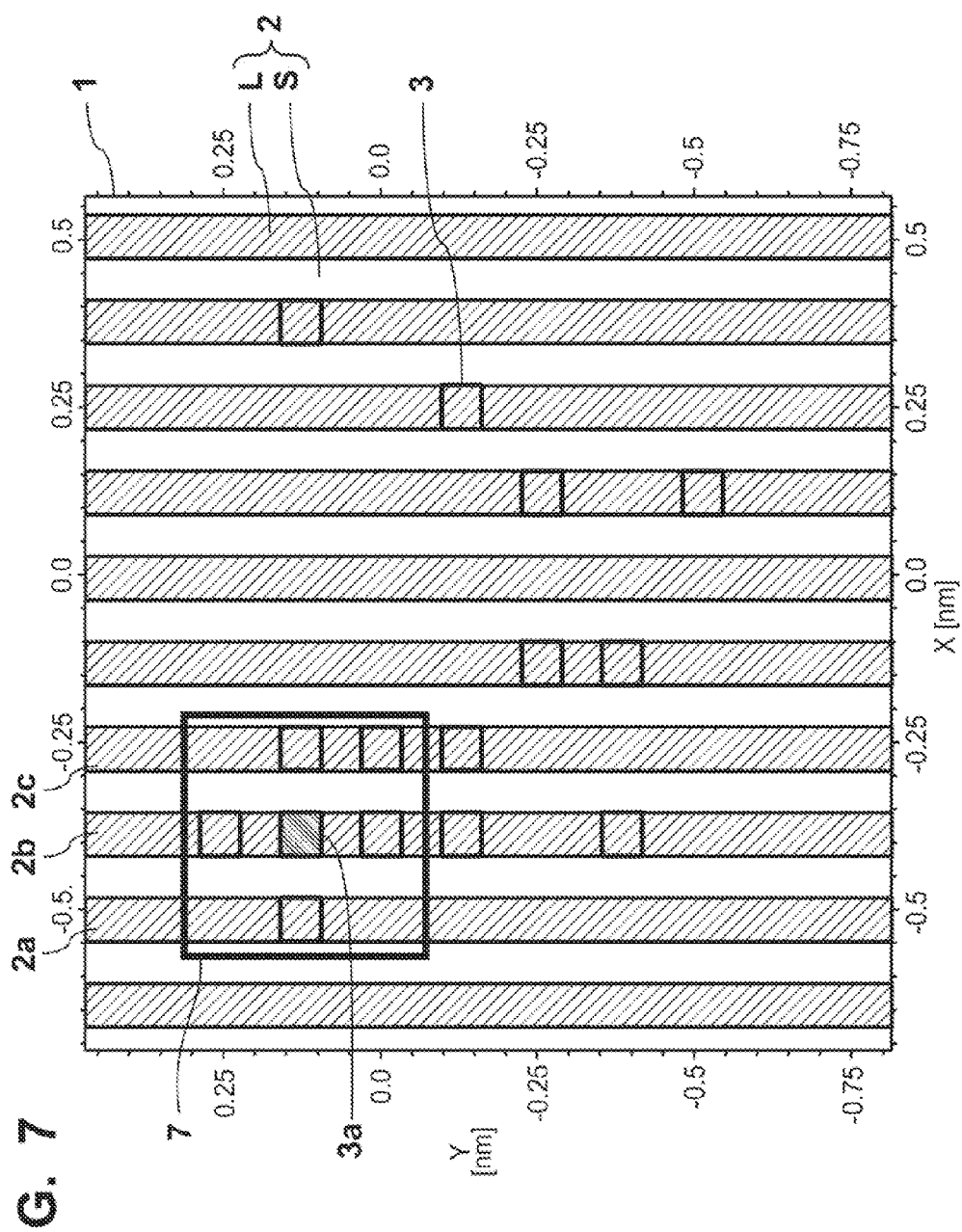
FIG. 7 is a view showing a cut pattern of interest and its peripheral region.
Figure 8:
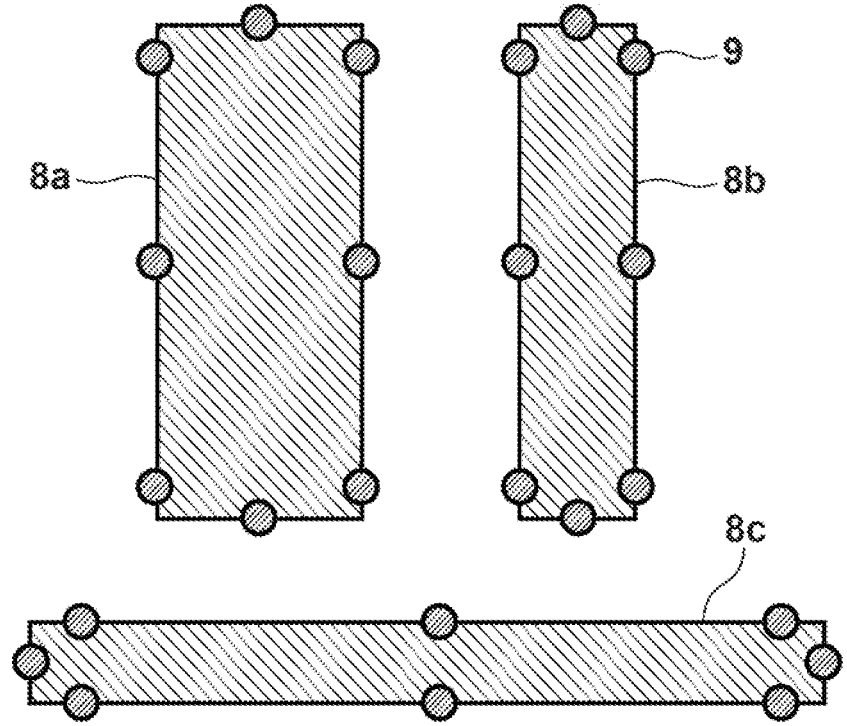
FIG. 8 is a view showing evaluation points in a two-dimensional circuit pattern.

In step S25, focus is placed on one cut pattern out of the plurality of cut patterns, and the density of the focused cut pattern (cut pattern of interest (pattern element of interest)) is calculated from the number of cut patterns included in the peripheral region surrounding the cut pattern of interest. For example, when setting a cut pattern 3a as the cut pattern of interest and calculating the density of the cut pattern 3a, as shown in FIG. 7, a peripheral region 7 is set so as to surround the cut pattern 3a. The peripheral region 7 is a square including the cut pattern 3a arranged at the center and having a side so long as to include three line patterns 2a, 2b, and 2c. The peripheral region 7 surrounding the cut pattern 3a includes six cut patterns (including the cut pattern 3a), as shown in FIG. 7. For this reason, the density of the cut pattern 3a can be calculated from the number of cut patterns inside the peripheral region 7. The step of setting the cut pattern of interest and calculating its density is performed for each of all the cut patterns, and the cut pattern density is calculated for each cut pattern. In the one-dimension layout technique, the density of the cut pattern of interest can be calculated from the number of cut patterns in the peripheral region, as described above. That is, providing only one evaluation point to be used to calculate the density for each cut pattern suffices, and the density of the cut pattern of interest can be calculated in a short time. On the other hand, in a two-dimensional circuit pattern as described in U.S. Pat. No. 7,739,650, since the structure of the circuit pattern is complex, at least one evaluation point needs to be set for each edge of the circuit pattern. For example, as shown in FIG. 8, even when rectangular patterns 8a, 8b, and 8c having relatively simple structures are used, one evaluation point 9 is set for each short side, and three evaluation points 9 are set for each long side. Hence, in the two-dimensional circuit pattern, a long time is needed for calculating the density of the circuit pattern.

Figure 9:
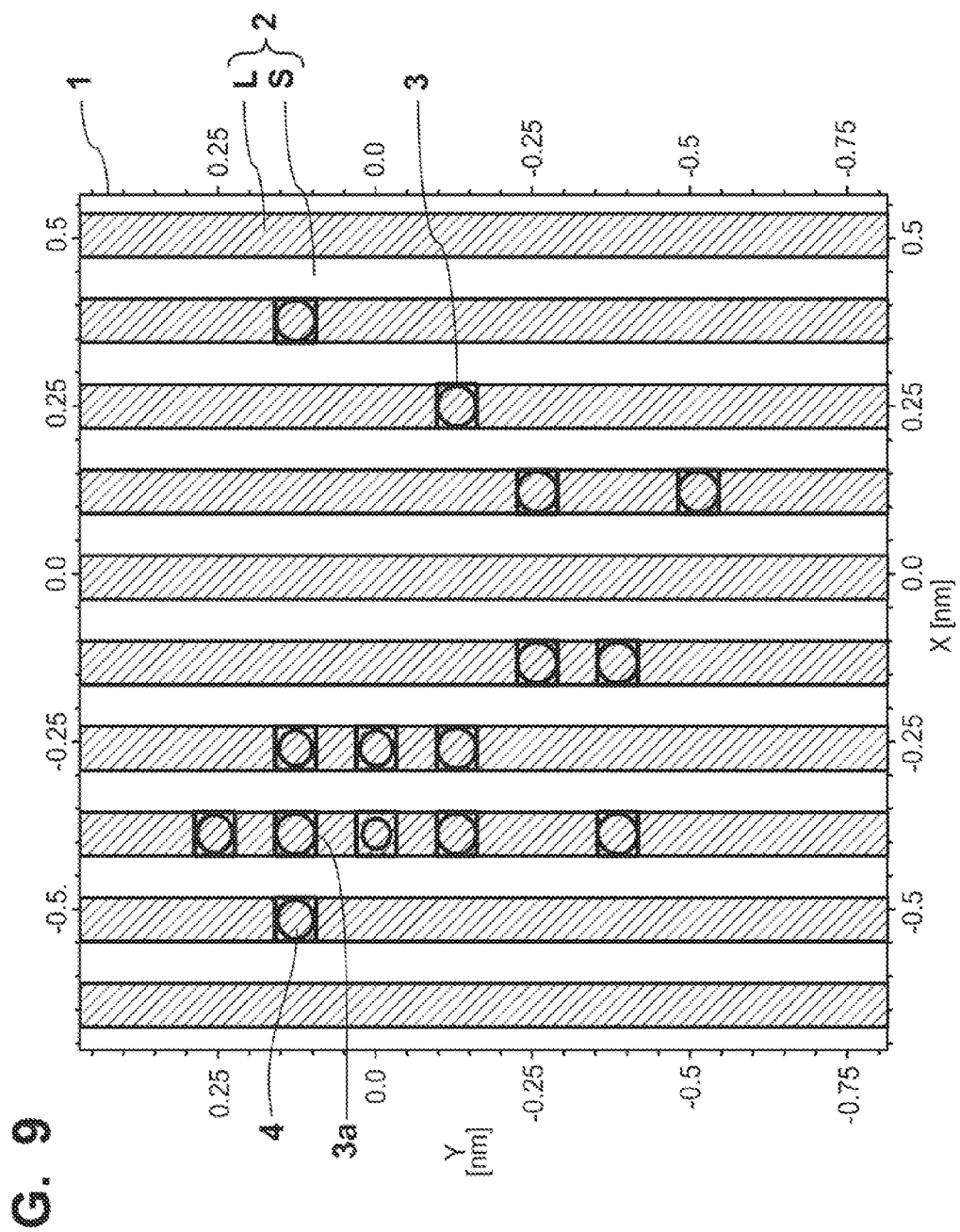
FIG. 9 is a view showing a result of optical image calculation using a reference value as the dimensions of the cut patterns according to the first embodiment.

In step S26, a dimension corresponding to the density of the cut pattern of interest (cut pattern 3a) calculated in step S25 is determined based on the relationship (FIG. 5) between the density and the dimension of the cut pattern derived in the steps shown in FIG. 3. The determined dimension is set as the reference value for the cut pattern of interest (cut pattern 3a). The reference value for the cut pattern of interest is set for each cut pattern, as shown in FIG. 2B, and used as the reference when calculating the dimension of each cut pattern whose transferred image obtains a dimension equal to the target dimension. FIG. 9 shows a result obtained by performing optical image calculation directly using the reference value set for each cut pattern in step S26 as the dimension of the cut pattern. A transferred image 4 indicated by a circle in FIG. 9 is transferred in all the cut patterns 3, and the dimension of the transferred image 4 is close to the target dimension, as compared to the case (FIG. 1) in which a design value is used as the dimensions of the cut patterns 3. It is therefore possible to make the dimension of the transferred image 4 close to the target dimension in the preprocessing of calculating the dimension of the cut pattern 3 whose transferred image 4 obtains a dimension equal to the target dimension. This indicates that the number of times of repeated computation necessary for obtaining the dimension of a cut pattern can be decreased, as will be described later.

Figure 10:
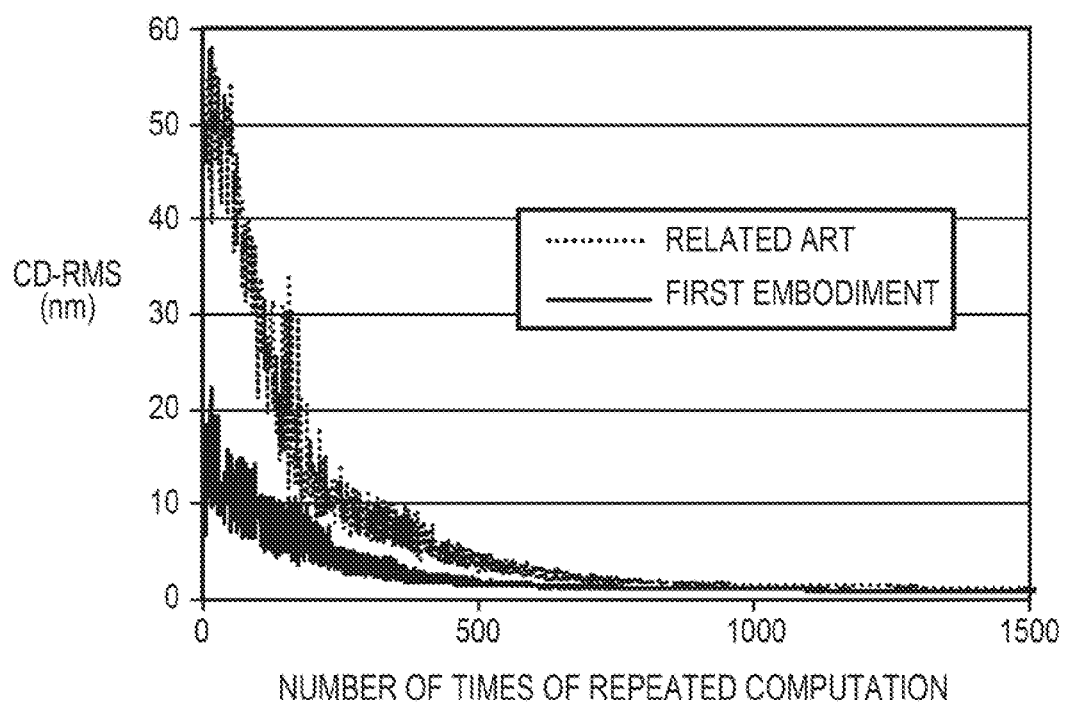
FIG. 10 is a graph showing a result of comparison of calculation transition between a correction method of the first embodiment and that of the related art.

In step S27, the dimension of the cut pattern of interest is calculated while being changed around the reference value, and the dimension of the cut pattern of interest whose transferred image obtains a dimension equal to the target dimension is determined. In the correction method according to the first embodiment, the reference value is set for each cut pattern. This allows to largely decrease the number of times of repeated computation necessary for calculating the dimension of the cut pattern whose transferred image obtains a dimension equal to the target dimension. FIG. 10 shows a result of comparison of calculation transition between the correction method of the first embodiment and that of the related art. In FIG. 10, the ordinate represents a CD-RMS (Critical Dimension-Root Mean Square) value for the target dimension. When the CD-RMS value is zero, the transferred images of all cut patterns have the target dimension. The abscissa represents the number of times of repeated computation. The number of times of calculation is proportional to the calculation time. Hence, the calculation time can be shortened by obtaining a CD-RMS value close to zero by a smaller number of times of calculation. As is apparent from FIG. 10, a CD-RMS value close to zero is obtained by a smaller number of times of calculation in the correction method of the first embodiment than in that of the related art. For example, the numbers of times of calculation to obtain a CD-RMS value of 1.0 nm are 1,485 in the related art and 1,092 in the first embodiment. This indicates that the calculation time can converge 1.35 times as fast as in the related art.

Second Embodiment

A correction method according to the second embodiment of the present invention will be described. In the correction method of the second embodiment, the step of calculating the density of a cut pattern is different from that of the correction method of the first embodiment. The density of a cut pattern is calculated by convoluting the cut pattern of interest by the distances between the cut pattern of interest (pattern element of interest) and the cut patterns included in the peripheral region.

Figure 11:
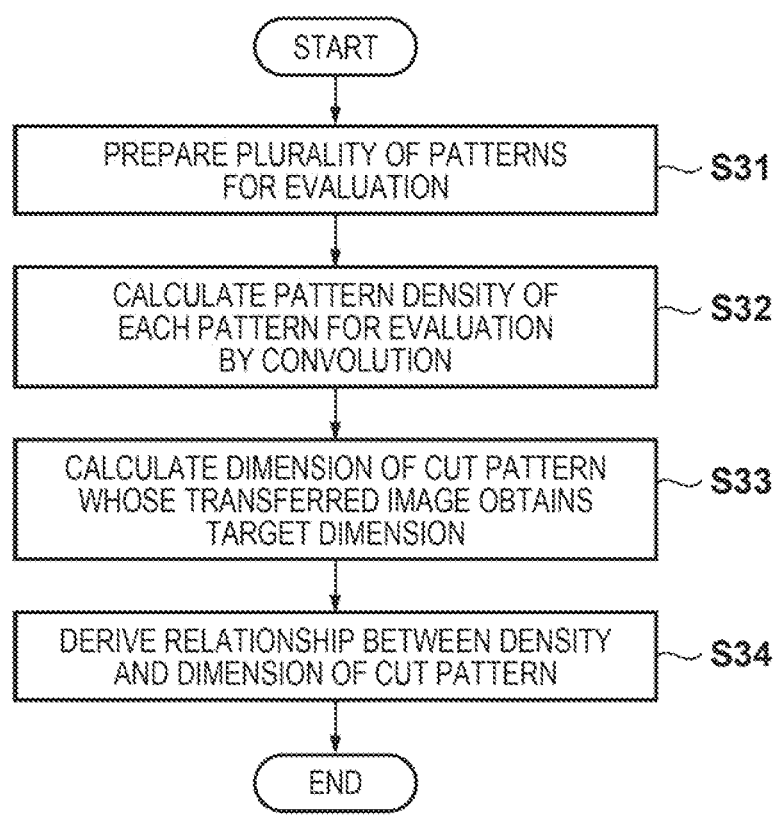
FIG. 11 is a flowchart showing a step of deriving the relationship between the density and the dimension of a cut pattern according to the second embodiment.

First, a step of deriving the relationship between the density and the dimension of a cut pattern from a plurality of patterns for evaluation will be described with reference to FIG. 11. FIG. 11 is a flowchart showing the step of deriving the relationship between the density and the dimension of a cut pattern using a plurality of patterns for evaluation.

In step S31, a plurality of patterns for evaluation are prepared. The plurality of patterns for evaluation include a plurality of cut patterns periodically arranged, respectively, as in step S21 of the first embodiment. The cut patterns in the plurality of patterns for evaluation have densities different from each other. The patterns for evaluation prepared in the second embodiment are the same as the patterns 5a to 5d for evaluation prepared in the first embodiment shown in FIG. 4, and a description thereof will be omitted.

Figure 12:
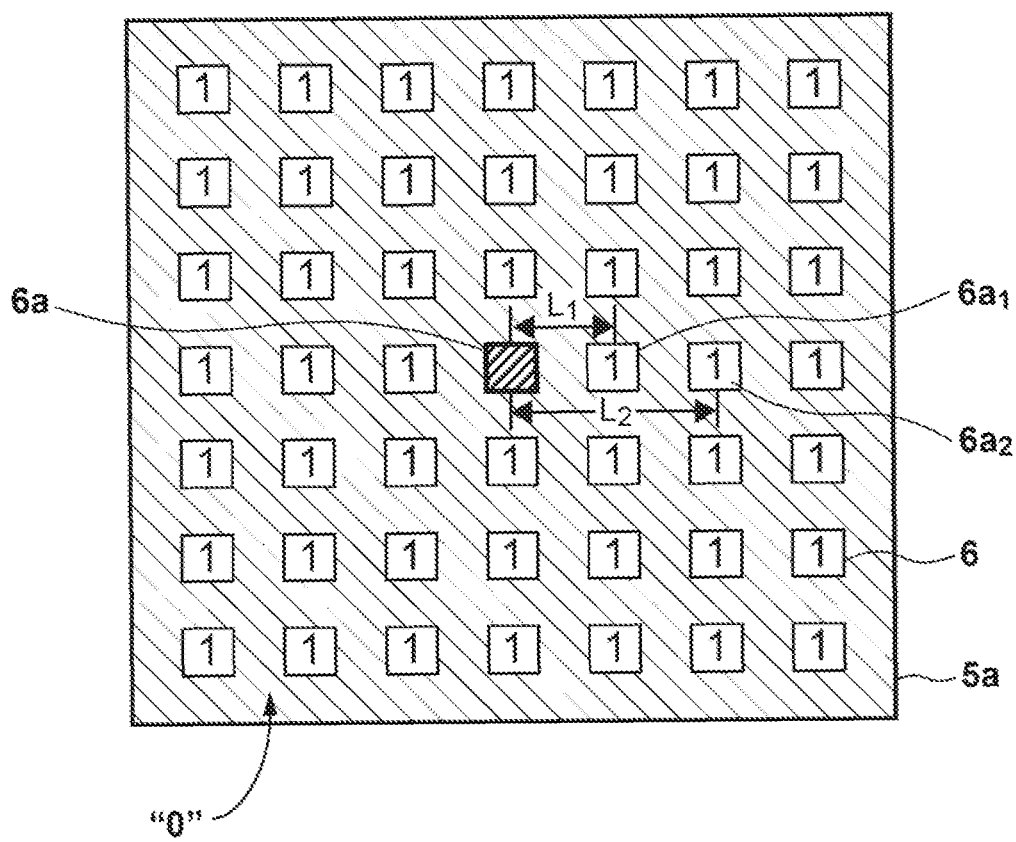
FIG. 12 is a view showing a cut pattern density calculation step according to the second embodiment.

In step S32, the cut pattern density in each pattern for evaluation is calculated. In the second embodiment, cut patterns 6a to 6d arranged centrally are convoluted by the distances between the cut patterns 6a to 6d and the cut patterns arranged in the periphery, thereby calculating the cut pattern density for each pattern for evaluation. As a detailed example, as shown in FIG. 12, a portion where a cut pattern 6 exists is defined as "1", and a portion where no cut pattern exists is defined as "0" in a pattern 5a for evaluation. Each cut pattern 6 is multiplied by a coefficient corresponding to the distance between the cut pattern 6a arranged at the center of the pattern 5a for evaluation and each cut pattern 6 arranged in the periphery, and all the cut patterns 6 multiplied by the coefficients are added. For example, a cut pattern $6a_1$ is spaced apart from the cut pattern 6a by a distance $L_1$ and therefore multiplied by a coefficient $k_1$ corresponding to the distance $L_1$ ($k_1 \times 1$). A cut pattern $6a_2$ is spaced apart from the cut pattern 6a by a distance $L_2$ and therefore multiplied by a coefficient $k_2$ corresponding to the distance $L_2$ ($k_2 \times 1$). In this way, all cut patterns ($6a_1$, $6a_2$, ...) arranged around the cut pattern 6a are multiplied by coefficients corresponding to the distances and added, thereby calculating the cut pattern density.

Figure 13:
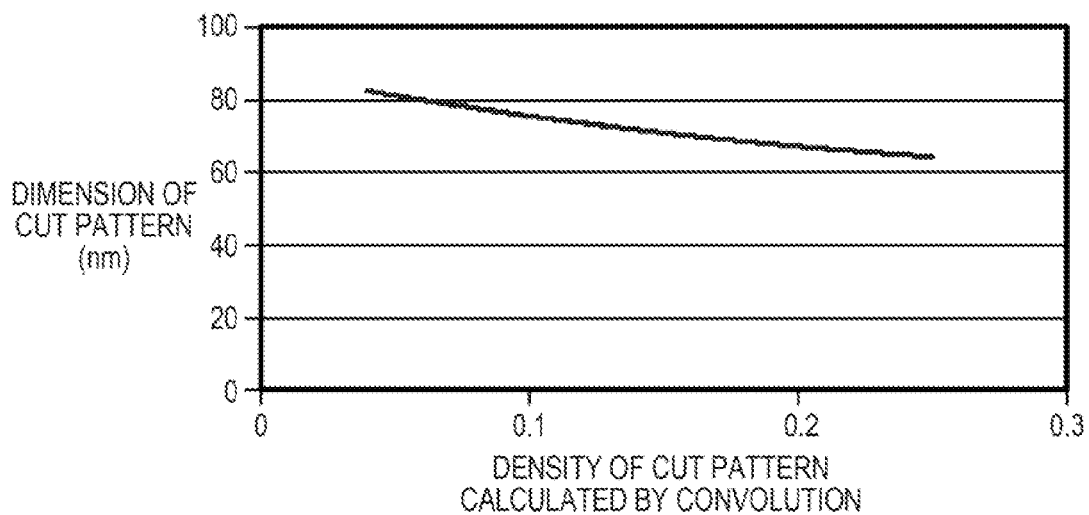
FIG. 13 is a graph showing the relationship between the density and the dimension of a cut pattern according to the second embodiment.

In step S33, the dimensions of the cut patterns 6a to 6d arranged centrally in the patterns 5a to 5d for evaluation are calculated by optical image calculation such that their transferred images on the substrate obtain a dimension equal to the target dimension (64 nm square). Step S33 is the same as step S23 of the first embodiment, and a description thereof will be omitted. In step S34, the relationship between the density and the dimension of a cut pattern is derived using the results in steps S32 and S33. FIG. 13 is a graph showing the relationship between the density and the dimension of a cut pattern derived using the four types of patterns for evaluation prepared in step S31. In FIG. 13, the abscissa represents the pattern density calculated by convolution, and the ordinate represents the dimension of a cut pattern whose transferred image has a dimension equal to the target dimension.

Figure 14:
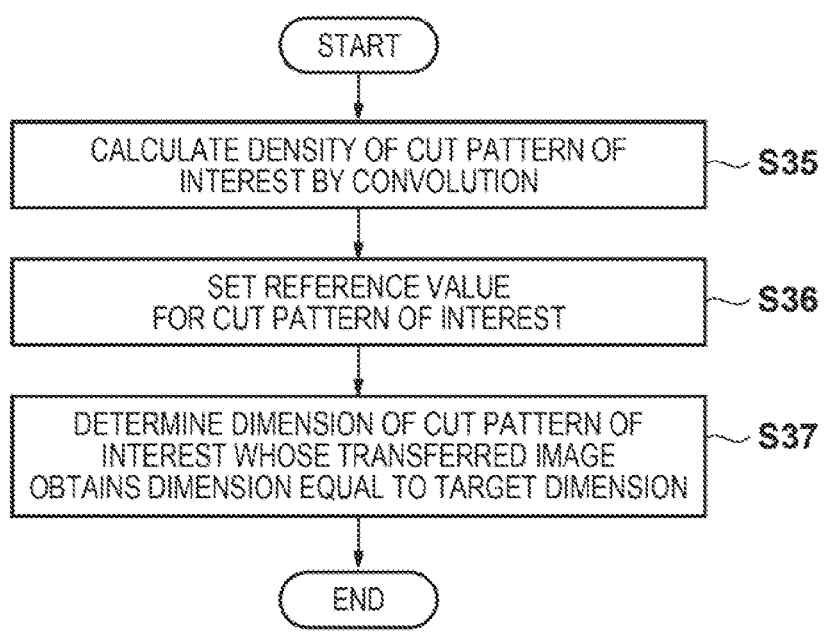
FIG. 14 is a flowchart showing steps until the dimension of a cut pattern is determined according to the second embodiment.

Steps of setting the reference value of the dimension of each cut pattern based on the relationship between the density and the dimension of a cut pattern derived using the patterns for evaluation and determining the dimension of the cut pattern whose transferred image obtains a dimension equal to the target dimension will be described with reference to FIG. 14. FIG. 14 is a flowchart showing the steps until the dimension of a cut pattern is determined.

In step S35, focus is placed on one cut pattern out of the plurality of cut patterns, and the density of the focused cut pattern (cut pattern of interest (pattern element of interest)) is calculated. In the second embodiment, the density of the cut pattern of interest is calculated by convoluting the cut pattern of interest by the distance between the cut pattern of interest and each cut pattern included in the peripheral region. As a detailed example, a portion where a cut pattern 3 exists is defined as "1", and a portion where no cut pattern exists is defined as "0", as in step S32. Each cut pattern 3 is multiplied by a coefficient corresponding to the distance between a cut pattern 3a of interest and each cut pattern 3 included in the peripheral region, and all the cut patterns 3 multiplied by the coefficients are added.

In step S36, a dimension corresponding to the density of the cut pattern of interest (cut pattern 3a) calculated in step S35 is determined based on the relationship (FIG. 13) between the density and the dimension of the cut pattern derived in the steps shown in FIG. 11. The determined dimension is set as the reference value for the cut pattern of interest (cut pattern 3a). The reference value for the cut pattern of interest is set for each cut pattern, as in step S26 of the first embodiment, and used as the reference when calculating the dimension of each cut pattern whose transferred image obtains a dimension equal to the target dimension.

Figure 15:
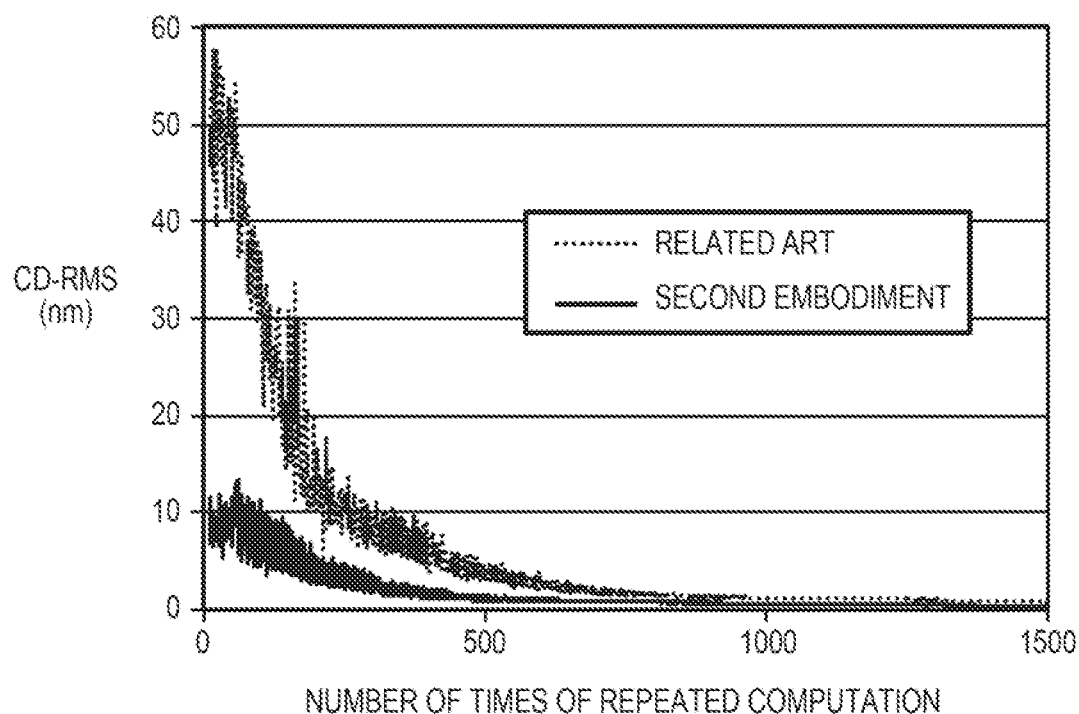
FIG. 15 is a graph showing a result of comparison of calculation transition between a correction method of the second embodiment and that of the related art.

In step S37, the dimension of the cut pattern of interest is calculated while being changed around the reference value, and the dimension of the cut pattern of interest whose transferred image obtains a dimension equal to the target dimension is determined, as in step S27 of the first embodiment. In the correction method according to the second embodiment, the reference value is set for each cut pattern. This allows to largely decrease the number of times of repeated computation necessary for calculating the dimension of a mask pattern whose transferred image obtains a dimension equal to the target dimension. FIG. 15 shows a result of comparison of calculation transition between the correction method of the second embodiment and that of the related art. As is apparent from FIG. 15, a CD-RMS value close to zero is obtained by a smaller number of times of calculation in the correction method of the second embodiment than in that of the related art, as in the correction method of the first embodiment. The numbers of times of calculation to obtain a CD-RMS value of 1.0 nm are 1,485 in the related art and 805 in the second embodiment. This indicates that the calculation time can converge 1.84 times as fast as in the related art. The speed of convergence is higher than in the first embodiment.

As described above, in the correction methods of the first and second embodiments, the reference value is set for each cut pattern based on the relationship between the density and the dimension of the cut pattern derived from a plurality of patterns for evaluation. The dimension of each cut pattern whose transferred image obtains a dimension equal to the target dimension is calculated while being changed around the reference value. This allows to largely shorten the time required for calculating the dimension of a cut pattern whose transferred image obtains a dimension equal to the target dimension. The correction methods of the first and second embodiments are executed under the condition of best focus and one type of exposure amount. However, the correction methods may be executed in consideration of a plurality of focuses and a plurality of exposure amounts. In the embodiments, a relatively small pattern element formed from a cut pattern is used. However, the techniques of the embodiments may be applied to a cell library or a full-chip having a large area. The embodiments are also applicable even when a structure including cut patterns connected to each other is included.

Embodiment of Information Processing Apparatus

Figure 16:
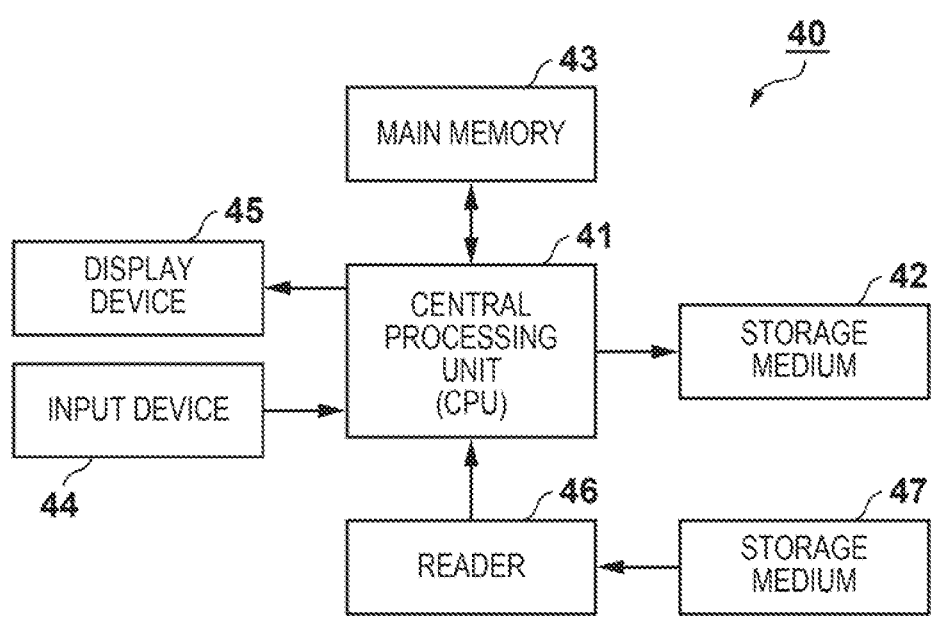
FIG. 16 is a block diagram showing the arrangement of an information processing apparatus.

The correction methods according to the first and second embodiments are executed using an optical simulator that calculates a light intensity distribution on an image plane when the images of cut patterns are formed on a substrate. FIG. 16 illustrates the arrangement of an information processing apparatus 40 including the optical simulator. The information processing apparatus 40 includes a central processing unit (CPU) 41, a storage medium 42 such as a hard disk used to store programs and data, and a main memory 43. The information processing apparatus 40 also includes an input device 44 such as a keyboard or a mouse, a display device 45 such as a liquid crystal display, and a reader 46 that reads out a program from a storage medium 47 such as a CD-ROM or a DVD-ROM. The storage medium 42, the main memory 43, the input device 44, the display device 45, and the reader 46 are connected to the central processing unit 41. In the information processing apparatus 40, the storage medium 47 storing a program for executing repeated computation while changing the dimension of a cut pattern is inserted in the reader 46. The program is read out from the storage medium 47 and stored in the storage medium 42. The program stored in the storage medium 42 is executed by the central processing unit 41 so as to execute calculation for proximity effect correction of the dimension of each cut pattern.

Data of the mask pattern in which the dimension is corrected is generated as described the above embodiment. The mask in which the pattern is drawn is manufactured by applying the generated mask data to a mask manufacturing apparatus (e.g. electron beam drawing apparatus) and drawing the pattern on a mask-blank based on the applied mask data.

The manufactured mask is mounted in a exposure apparatus. the exposure apparatus exposes a substrate on which photoresist is coated. the exposure apparatus illuminates the mask (reticle) via an illumination optical system using light emitted from a light source, and projects a pattern image of the mask to the substrate via a projection optical system. Thereby the exposed substrate is developed. The semiconductor device is manufactured by further performing other known steps (for example, oxidation, film formation, vapor deposition, doping, planarization, etching, resist removal, dicing, bonding, and packaging) on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103833 filed on Apr. 27, 2012, which is hereby incorporated by reference herein in its entirety.

What is claimed is:

1. A pattern correction method of, when a plurality of pattern elements on a mask used to process line patterns formed on a substrate are transferred to the substrate, performing proximity effect correction of a pattern element, among the plurality of pattern elements, so that a transferred image has a target dimension, the method comprising the steps of:

setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;

calculating a dimension of transferred image of the pattern element of interest while changing a dimension of the pattern element of interest around the reference value; and determining the dimension of the pattern element of interest based on the calculation result.

2. The method according to claim 1, further comprising a step of calculating the density of the pattern elements in the peripheral region surrounding the pattern element of interest.

3. The method according to claim 1, wherein the reference value is set based on a relationship between the density of pattern elements and the dimension of the pattern element whose transferred image formed under the density of the pattern elements in the peripheral region surrounding the pattern element of interest has the target dimension.

4. The method according to claim 3, wherein the relationship is determined using a plurality of patterns for evaluation including pattern elements whose densities are different from each other.

5. The method according to claim 2, wherein the density of the pattern elements in the peripheral region surrounding the pattern element of interest is calculated based on the number of pattern elements included in the peripheral region.

6. The method according to claim 2, wherein the density of the pattern elements in the peripheral region surrounding the pattern element of interest is calculated by convoluting the pattern element of interest by a distance between the pattern element of interest and the pattern elements included in the peripheral region.

7. The method according to claim 1, wherein the reference value for the pattern element of interest is set to a different value in accordance with the density of the pattern elements in the peripheral region surrounding the pattern element of interest.

8. The method according to claim 1, wherein the transferred image of the pattern element of interest having a determined dimension has the target dimension.

9. The method according to claim 4, wherein the pattern elements included in each of the plurality of patterns for evaluation have a same shape and are periodically arranged.

10. The method according to claim 4, wherein the density in each of the plurality of patterns is defined by the ratio of a portion where the pattern elements exist and a portion where the pattern elements do not exist.

11. The method according to claim 3, wherein the reference value is set to a dimension of a pattern element corresponding to the density of the pattern elements in the peripheral region based on the relationship.

12. A non-transitory computer-readable storage medium storing a program for causing a computer in an information processing apparatus to execute a pattern correction method of, when a plurality of pattern elements on a mask used to process line patterns formed on a substrate are transferred to the substrate, performing proximity effect correction of a pattern element, among the plurality of pattern elements, so that a transferred image has a target dimension, the method comprising the steps of:
setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;
calculating a dimension of the pattern element of interest while changing a dimension of the pattern element of interest around the reference value; and
determining the dimension of the pattern element of interest based on the calculation result.

13. A method of manufacturing a mask comprising the steps of:
generating data of a mask pattern that includes a pattern corrected by a pattern correction method; and
manufacturing the mask using the generated data of the mask pattern in the data generating step,
wherein the pattern correction method, when a plurality of pattern elements on a mask used to process line patterns formed on a substrate are transferred to the substrate, performs proximity effect correction of a pattern element, among the plurality of pattern elements, so that a transferred image has a target dimension, and comprises the steps of:
setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;
calculating a dimension of transferred image of the pattern element of interest while changing a dimension of the pattern element of interest around the reference value; and
determining the dimension of the pattern element of interest based on the calculation result.

14. A method of manufacturing a device, the method comprising:
exposing a substrate using a mask; and
developing the exposed substrate,
wherein the mask is manufactured by a method comprising the steps of:
generating data of a mask pattern that includes a pattern corrected by a pattern correction method; and
manufacturing the mask using the generated data of the mask pattern in the data generating step,
wherein the pattern correction method, when a plurality of pattern elements on a mask used to process line patterns formed on a substrate are transferred to the substrate, performs proximity effect correction of a pattern element, among the plurality of pattern elements, so that a transferred image has a target dimension, and comprises the steps of:
setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;
calculating a dimension of transferred image of the pattern element of interest while changing a dimension of the pattern element of interest around the reference value; and
determining the dimension of the pattern element of interest based on the calculation result.

15. A pattern correction method of, when a plurality of pattern elements on a mask are transferred to the substrate, performing proximity effect correction of a pattern element, among the plurality of pattern elements, so that a transferred image has a target dimension, the method comprising the steps of:
setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;

calculating a dimension of transferred image of the pattern element of interest while changing a dimension of the pattern element of interest around the reference value; and determining the dimension of the pattern element of interest based on the calculation result.

16. A non-transitory computer-readable storage medium storing a program for causing a computer in an information processing apparatus to execute a pattern correction method of, when a plurality of pattern elements on a mask are transferred to the substrate, performing proximity effect correction of a pattern element, among the plurality of pattern elements, so that a transferred image has a target dimension, the method comprising the steps of:

setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;

calculating a dimension of the pattern element of interest while changing a dimension of the pattern element of interest around the reference value; and determining the dimension of the pattern element of interest based on the calculation result.

17. A method of manufacturing a mask comprising the steps of:

generating data of a mask pattern that includes a pattern corrected by a pattern correction method; and manufacturing the mask using the generated data of the mask pattern in the data generating step, wherein the pattern correction method, when a plurality of pattern elements on a mask are transferred to the substrate, performs proximity effect correction of a pattern element, among the plurality of pattern elements, so that a transferred image has a target dimension, and comprises the steps of:

setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;

calculating a dimension of transferred image of the pattern element of interest while changing a dimension of the pattern element of interest around the reference value; and determining the dimension of the pattern element of interest based on the calculation result.

18. A method of manufacturing a device, the method comprising:

exposing a substrate using a mask; and developing the exposed substrate, wherein the mask is manufactured by a method comprising the steps of:

generating data of a mask pattern that includes a pattern corrected by a pattern correction method; and manufacturing the mask using the generated data of the mask pattern in the data generating step, wherein the pattern correction method, when a plurality of pattern elements on a mask are transferred to the substrate, performs proximity effect correction of a pattern element, among the plurality of pattern elements, so that a transferred image has a target dimension, and comprises the steps of:

setting, based on a density of pattern elements in a peripheral region surrounding a pattern element of interest, among the plurality of pattern elements, a dimension of a pattern element whose transferred image formed under the density of the pattern elements in the peripheral region surrounding the pattern element of interest has the target dimension as a reference value for the pattern element of interest;

calculating a dimension of transferred image of the pattern element of interest while changing a dimension of the pattern element of interest around the reference value; and determining the dimension of the pattern element of interest based on the calculation result.

* * * * *